(12) United States Patent
Li et al.

(10) Patent No.: US 9,179,572 B2
(45) Date of Patent: Nov. 3, 2015

(54) SERVER

(71) Applicants: Inventec (Pudong) Technology Corporation, Shanghai (CN); INVENTEC CORPORATION, Taipei (TW)

(72) Inventors: Ming-Gang Li, Shanghai (CN); Ji-Peng Xu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 197 days.

(21) Appl. No.: 14/029,554

(22) Filed: Sep. 17, 2013

(65) Prior Publication Data

US 2015/0043146 A1 Feb. 12, 2015

(30) Foreign Application Priority Data

Aug. 6, 2013 (CN) .......................... 2013 1 0340450

(51) Int. Cl.
  H05K 1/14 (2006.01)
  H05K 7/14 (2006.01)
(52) U.S. Cl.
  CPC ................................. *H05K 7/1487* (2013.01)

(58) Field of Classification Search
  USPC .................. 361/736, 727, 728, 756, 800, 796
  See application file for complete search history.

(56) References Cited

U.S. PATENT DOCUMENTS

| | | | |
|---|---|---|---|
| 6,574,100 B1 * | 6/2003 | Anderson | 361/679.5 |
| 7,031,152 B1 * | 4/2006 | Tsai et al. | 361/679.33 |
| 7,872,866 B1 * | 1/2011 | Wang | 361/695 |
| 7,952,864 B2 * | 5/2011 | Wang et al. | 361/679.33 |
| 8,711,569 B2 * | 4/2014 | Yi | 361/730 |
| 2010/0027213 A1 * | 2/2010 | Wu et al. | 361/679.39 |
| 2010/0271766 A1 * | 10/2010 | Lin | 361/679.02 |

* cited by examiner

*Primary Examiner* — Hung S Bui
(74) *Attorney, Agent, or Firm* — Locke Lord LLP; Tim Tingkang Xia, Esq.

(57) ABSTRACT

A server includes a shell and at least one server assembly. The shell has a first accommodation space. The server assembly includes a motherboard tray, a motherboard module, a bearing frame and a storage device. The motherboard tray is detachably located in the first accommodation space. The motherboard module is located on the motherboard tray. The motherboard module includes a motherboard and at least one central processing unit which are located on the motherboard. The bearing frame having a loading plate is fastened to the motherboard tray and is located above the motherboard module. The storage device is detachably located on the loading plate.

14 Claims, 4 Drawing Sheets

SERVER

CROSS-REFERENCE TO RELATED APPLICATIONS

This non-provisional application claims priority under 35 U.S.C. §119(a) on Patent Application No(s). 2013103404500 filed in China on Aug. 6, 2013, the entire contents of which are hereby incorporated by reference.

TECHNICAL FIELD

The disclosure relates to a server, more particularly to a server having a superior interior space allocation.

BACKGROUND

With the development of technology, servers have been widely used for data processing systems in the industry. Generally, the server includes a motherboard, a power supply, a variety of kinds of hard discs . . . , etc.

The related industry wants to raise the operating efficiency of the server for providing better service to consumers. The operating efficiency of the server is directly proportional to the number of the motherboards. In other words, if the number of the motherboards is increased, the operating efficiency of the server will be increased accordingly. However, it is impossible to unlimitedly increase the number of the motherboards because of the limitation of the interior space of the server. Therefore, how to optimize the interior space inside the server is one of the significant issues for people in the industry who want to increase the number of the motherboards as much as possible in the limited interior space of the server to raise the operating efficiency.

SUMMARY

An embodiment of the disclosure provides a server comprising a shell and at least one server assembly. The shell has a first accommodation space. The server assembly comprises a motherboard tray, a motherboard module, a bearing frame and a storage device. The motherboard tray is detachably located in the first accommodation space. The motherboard module is located on the motherboard tray. The motherboard module comprises a motherboard and at least one central processing unit which are located on the motherboard. The bearing frame having a loading plate is fastened to the motherboard tray and is located above the motherboard module. The storage device is detachably located on the loading plate.

BRIEF DESCRIPTION OF THE DRAWINGS

The disclosure is more fully understood from the detailed description given herein below for illustration only, and thus are not limitative of the disclosure, and wherein.

DETAILED DESCRIPTION

Figure 1:
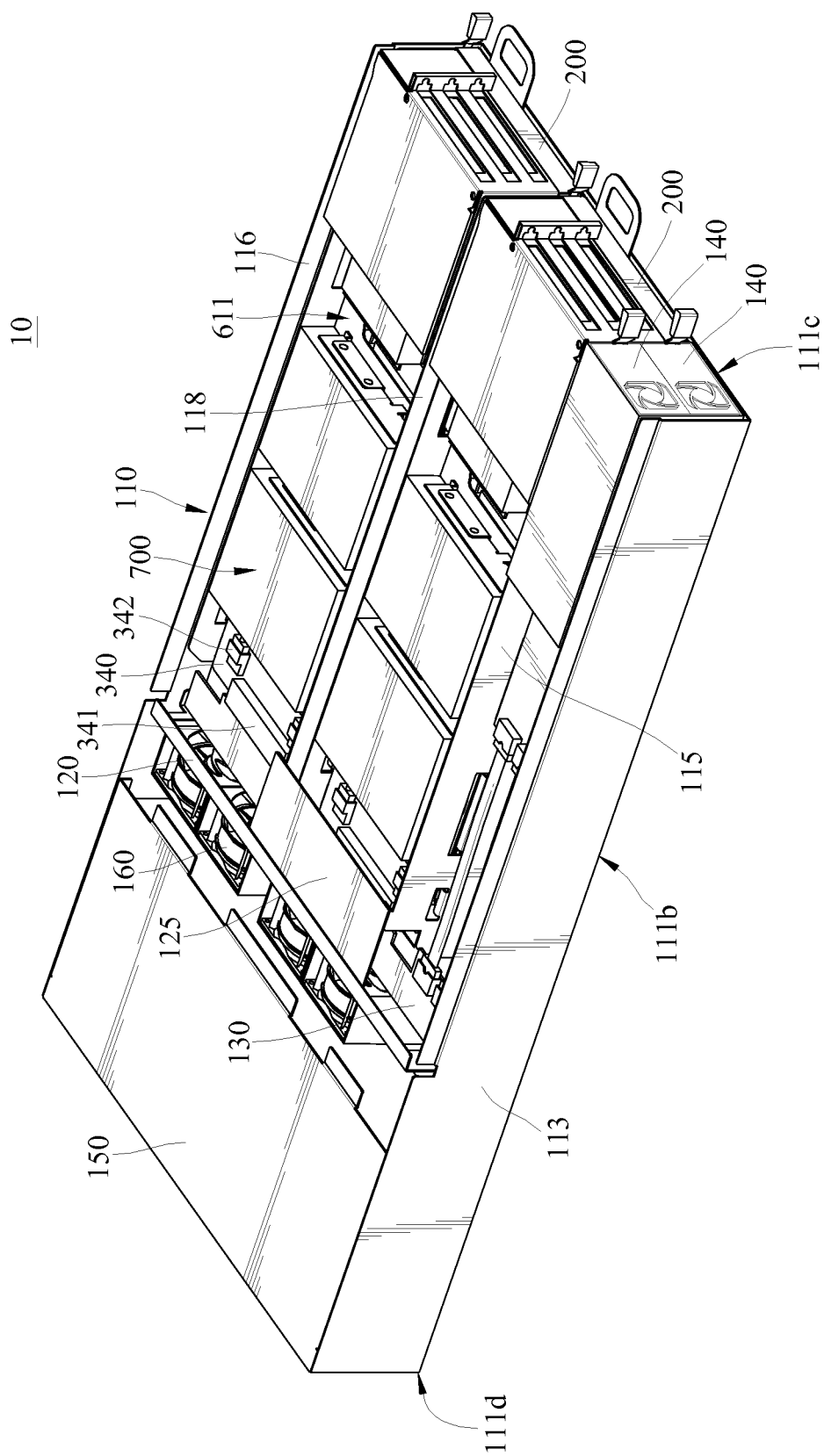
FIG. 1 is a perspective view of a server according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
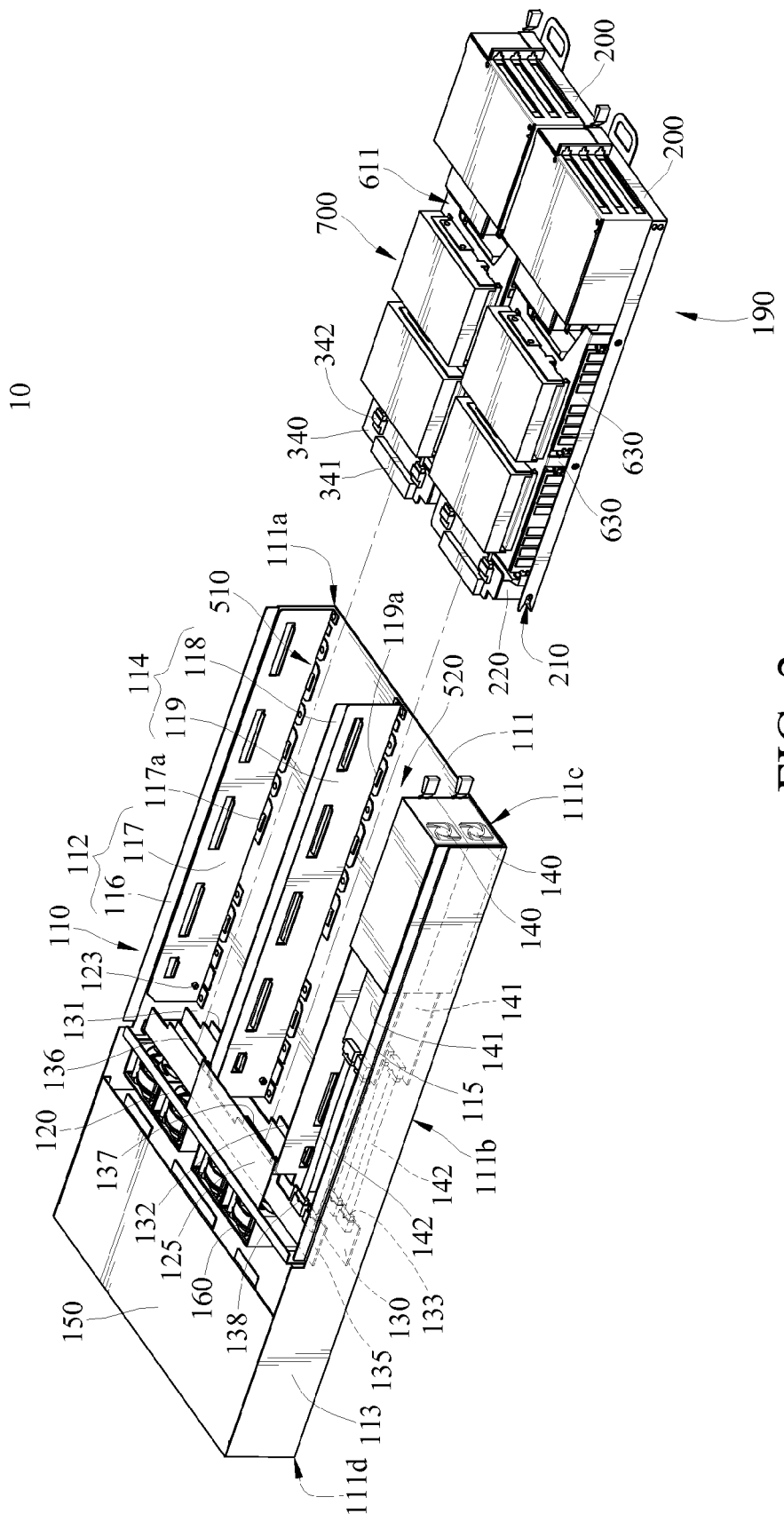
FIG. 2 is an exploded view of the server described in FIG. 1.
Figure 3:
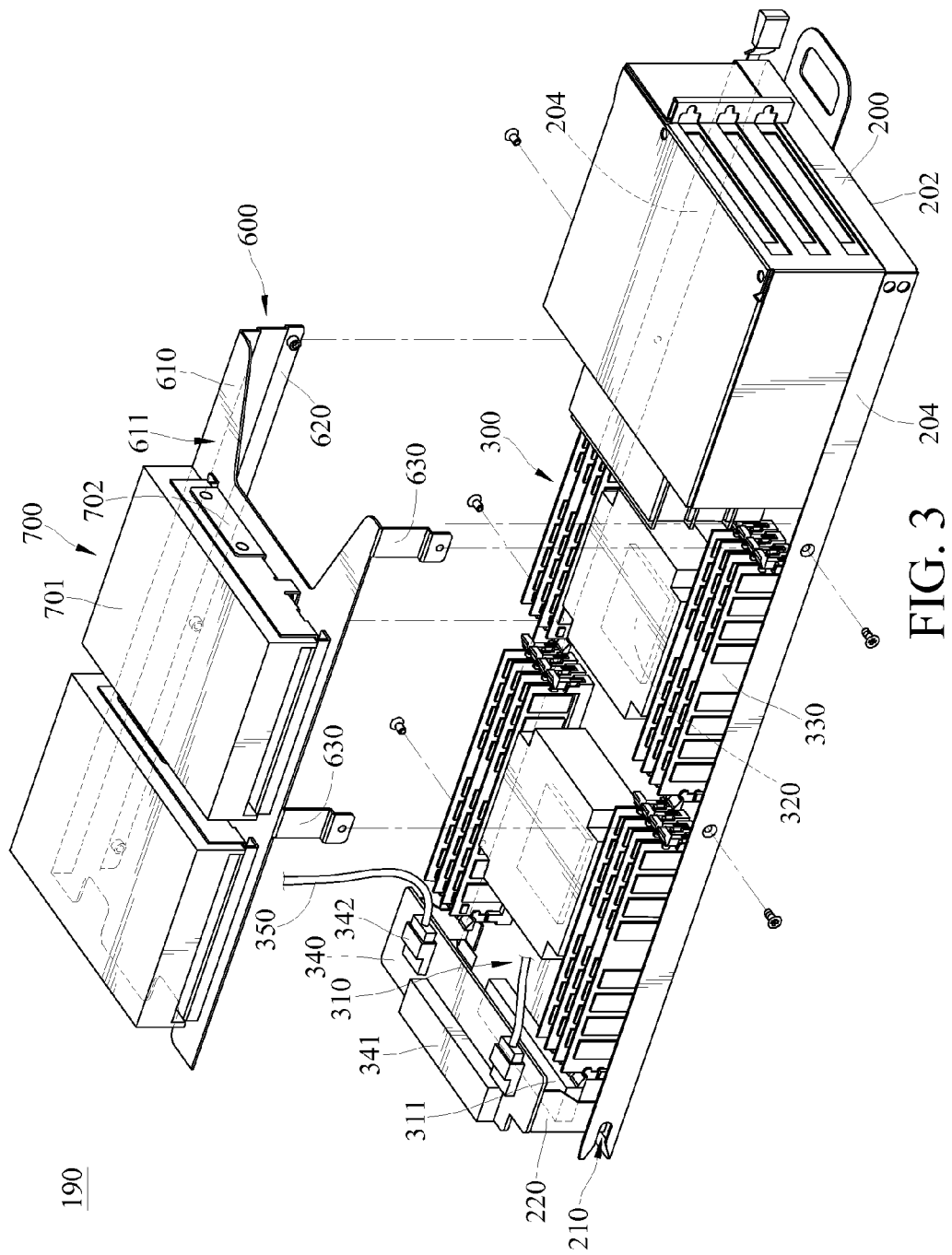
FIG. 3 is an exploded view of a motherboard module and a bearing frame described in FIG. 2.
Figure 4:
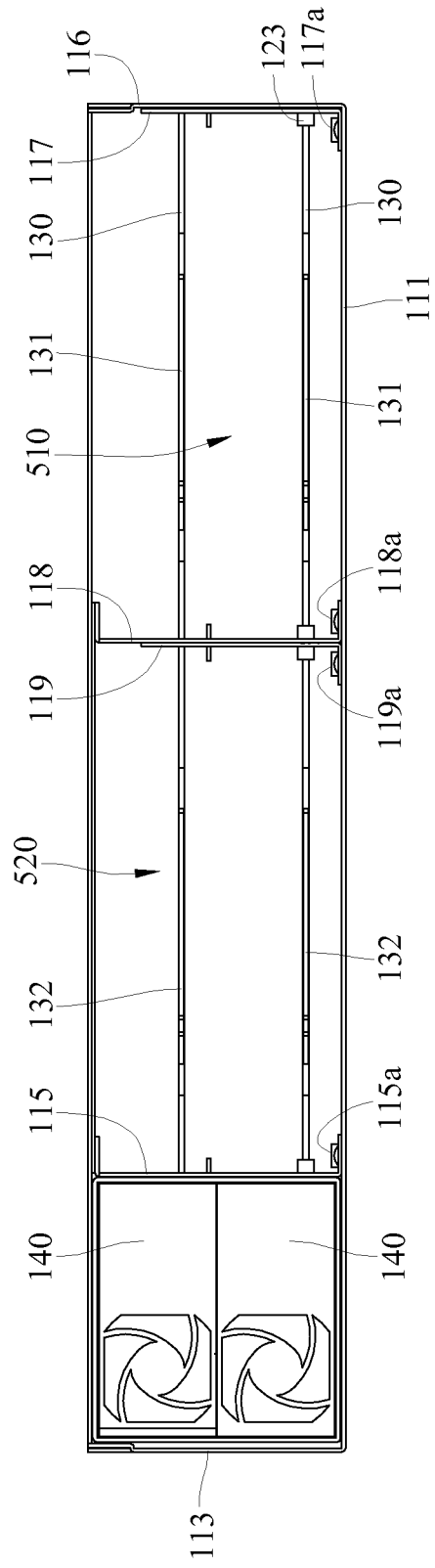
FIG. 4 is a front view of a shell described in FIG. 2.

Please refer to FIG. 1 to FIG. 4, FIG. 1 is a perspective view of a server according to an embodiment of the disclosure, FIG. 2 is an exploded view of the server described in FIG. 1, FIG. 3 is an exploded view of a motherboard module and a bearing frame described in FIG. 2, and FIG. 4 is a front view of a shell described in FIG. 2.

The server 10 of the disclosure comprises a shell 110, a first adaption board 130, a second adaption board 135, two power supply units 140, a data storage module 150, a plurality of fans 160 and two server assemblies 190.

The shell 110 includes a base plate 111, a first lateral plate 112, a second lateral plate 113, a first partition plate 114 and a second partition plate 115. The base plate 111 includes a first side edge 111a, a second side edge 111b, a third side edge 111c and a fourth side edge 111d. The second side edge 111b is opposite to the first side edge 111a, and the third side edge 111c and the fourth side edge 111d are located between the first side edge 111a and the second side edge 111b. The first lateral plate 112 and the second lateral plate 113 are erected on the first side edge 111a and the second side edge 111b of the base plate 111, respectively. The first partition plate 114 and the second partition plate 115 are located between the first lateral plate 112 and the second lateral plate 113 of the base plate 111, respectively, and the first partition plate 114 is located between the first lateral plate 112 and the second partition plate 115. Moreover, the first lateral plate 112, the second lateral plate 113, the first partition plate 114 and the second partition plate 115 are substantially parallel to each other; namely, in addition to the assembly error and the processing tolerance, the first lateral plate 112, the second lateral plate 113, the first partition plate 114 and the second partition plate 115 are mutually parallel.

Furthermore, the first lateral plate 112 comprises a first plate member 116 and a second plate member 117 which are abutting against each other. The second plate member 117 is located between the first plate member 116 and the first partition plate 114. The first partition plate 114 comprises a third plate member 118 and a fourth plate member 119 which are abutting against each other, and the third plate member 118 is located between the second plate member 117 and the fourth plate member 119. The second plate member 117 and the third plate member 118 form a first accommodation space 510 therebetween; whereas the fourth plate member 119 and the second partition plate 115 form a second accommodation space 520 therebetween. Moreover, the second plate member 117 has at least one first support part 117a and the third plate member 118 has at least one first support part 118a. The at least two first support parts 117a, and 118a are opposite to each other. The fourth plate member 119 has at least one second support part 119a and the second partition plate 115 has at least one second support part 115a. The at least two second support parts 115a, and 119a are opposite to each other.

The second plate member 117, the third plate member 118 and both of the first support parts 117a, and 118a, which are respectively located on the second plate member 117 and the third plate member 118, form the first accommodation space 510 therebetween. The first support parts 117a, and 118a, which are respectively located on the second plate member 117 and the third plate member 118, form the guiding rails inside the first accommodation space 510, in order to make the server assemblies 190 movable from the first accommodation space 510 along the first support parts 117a, and 118a. The fourth plate member 119, the second partition plate 115 and both of the second support parts 115a, and 119a, which are respectively located on the fourth plate member 119 and the second partition plate 115 form the second accommodation space 520 therebetween. The second support parts 115a, and 119a, which are respectively located on the fourth plate member 119 and the second partition plate 115, form the guiding rails inside the second accommodation space 520, in order to make the server assemblies 190 moveable from the second accommodation space 520 along the second support parts 115a, and 119a.

In this embodiment of the disclosure, the second plate member 117, the third plate member 118, the fourth plate member 119 and the second partition plate 115 are riveted to the base plate 111, but the disclosure is not limited thereto. In some embodiments of the disclosure, the second plate member 117, the third plate member 118, the fourth plate member 119 and the second partition plate 115 are screwed to the base plate 111.

In addition, in the embodiment of the disclosure, the first support parts 117a, 118a and the second support parts 115a, 119a are formed by stamping, but the disclosure is not limited thereto. In some embodiments of the disclosure, the first support parts 117a, 118a and the second support parts 115a, 119a are individual components and are connected to the second plate member 117, the third plate member 118, the fourth plate member 119 and the second partition plate 115, respectively.

In this embodiment of the disclosure, the second plate member 117, the third plate member 118, the fourth plate member 119 and the second partition plate 115 each have a positioning column 123.

In this and some other embodiments of the disclosure, the shell 110 further comprises an assembling wall 120 having two sides which are opposite to each other and which are connected with the first lateral plate 112 and the second lateral plate 113, respectively. The second plate member 117, the third plate member 118, the fourth plate member 119 and the second partition plate 115 are all located between the assembling wall 120 and the third side edge 111c.

In this and some other embodiments of the disclosure, the server 10 further comprises a reinforcement plate 125, which is located above the second accommodation space 520. One side of the reinforcement plate 125 is fastened to the first partition plate 114 whereas the other side of the reinforcement plate 125 is fastened to the second partition plate 115. Moreover, in some embodiments of the disclosure, the reinforcement plate 125 is further connected to the assembling wall 120 and used to enhance the strength of the first partition plate 114 and the second partition plate 115.

In this embodiment of the disclosure, the first adaption board 130 and the second adaption board 135, which are parallel to the base plate 111, are located between the first lateral plate 112 and the second lateral plate 113, and the second adaption board 135 is located above the first adaption board 130. The first adaption board 130 has a first electrical connection part 131, a second electrical connection part 132 and a third electrical connection part 133. The second adaption board 135 has a first electrical connection part 136, a second electrical connection part 137 and a third electrical connection part 138. The two first electrical connection parts 131 and 136 correspond to and are located in the first accommodation space 510, whereas the two second electrical connection parts 132 and 137 correspond to and are located in the second accommodation space 520. The third electrical connection parts 133 and 138 are located between the second partition plate 115 and the second lateral plate 113. The first electrical connection parts 131 and 136, the second electrical connection parts 132 and 137 and the third electrical connection parts 133 and 138 are metal electrodes coated on the surface of the printed circuit board.

The two power supply units 140 are both located between the second partition plate 115 and the second lateral plate 113, and each of the power supply units 140 has an adaption board 141 and a cable 142. The two adaption boards 141 are electrically connected to the two third electrical connection parts 133 by the two cables 142, respectively. In this embodiment of the disclosure, the two power supply units 140 are located inside a cubic container, but the disclosure is not limited thereto. In some other embodiments of the disclosure, the two power supply units 140 may not be located inside the cubic container.

The data storage module 150 is located on the base plate 111 and is adjacent to the fourth side edge 111d of the base plate 111. In this embodiment, the data storage module 150 is located at the fourth side edge 111d. The data storage module 150 has several hard disc drivers in an array arrangement.

A plurality of fans 160 are located on the assembling wall 120, and are located between the data storage module 150 and the assembling wall 120. The fans 160 generate the airflow toward the first accommodation space 510 and the second accommodation space 520 for heat dissipation.

The two server assemblies 190 are detachably located in the first accommodation space 510 and the second accommodation space 520. Each of the server assemblies 190 includes a motherboard tray 200, a motherboard module 300, a bearing frame 600 and a storage device 700. The motherboard tray 200 includes a bottom wall 202 and two side walls 204. The side walls 204 are connected with the bottom wall 202. The server assemblies 190 further comprises a signal adaption board 340 and a support bracket 220 located on a side of the motherboard tray 200 close to the assembling wall 120. The motherboard module 300 includes a motherboard 310, at least one central processing unit 320 and at least one memory module 330. The motherboard 310 is located on the motherboard tray 200. The at least one central processing unit 320 and the at least one memory module 330 are located on and electrically connected to the motherboard 310. The signal adaption board 340 is located on the support bracket 220. The signal adaption board 340 has a fifth electrical connection part 341 and a sixth electrical connection part 342. The fifth electrical connection part 341 is an electrical connector which is corresponded to the signal adaption board 340. When each of the motherboard trays 200 is located inside each of the accommodation spaces 510, and 520, the fifth electrical connection part 341, inside the first accommodation space 510, is electrically connected with the first electrical connection part 136 of the second adaption board 135, whereas the fifth electrical connection part 341, inside the second accommodation space 520, is electrically connected with the second electrical connection part 137 of the second adaption board 135. The first support parts 117a, and 118a support the motherboard tray 200 of the server assembly 190 in the first accommodation space 510. The second support parts 115a, and 119a support the motherboard tray 200 of the server assembly 190 in the second accommodation space 520.

In this embodiment, each of the motherboards 310 has a fourth electrical connection part 311, the fourth electrical connection parts 311 are detachably connected with the first electrical connection part 131 and the second electrical connection part 132 of the first adaption board 130, in order to make the motherboards 310 connected with the power supply units 140 via the first adaption board 130. In this embodiment of the disclosure, the number of the central processing units is two and the number of the memory module is sixteen, because each of the two opposite sides of the central processing unit 320 has four memory modules 330.

Each of the side walls 204 has a positioning slot 210 that is located on a side of the motherboard tray 200 close to the assembling wall 120 and each of the positioning slots 210 is detachably engaged to each of the positioning columns 123 respectively, in order to make the fourth electrical connection part 311 of the motherboard 310 on the motherboard tray 200 stay on the same level height as the first electrical connection part 131 and the second electrical connection part 132 of the first adaption board 130, namely, the motherboard 310 can be smoothly connected to the first adaption board 130 or withdrawn from the first adaption board 130. In addition, it decreases the possibility of damage of the circuit between the motherboard 310 and the first adaption board 130.

The bearing frame 600 is located above the motherboard module 300 and is securely fastened to the motherboard tray 200. The bearing frame 600 is screwed or riveted to the motherboard tray 200. In this embodiment, the bearing frame 600 comprises a loading plate 610 and a plurality of supporting mechanisms extending from the loading plate 610 toward the bottom wall 202 of the motherboard tray 200, the plurality of supporting mechanisms locate at two opposite side of the loading plate 610 and each are fastened to the motherboard tray 200. The plurality of the supporting mechanisms comprise a side plate 620 and a plurality of supporting legs 630. The loading plate 610 and the motherboard 310 face each other and are separated by a distance, and the loading plate 610 has a loading surface 611. The loading plate 610 is located above the motherboard module 300. The storage device 700 is detachably located on the loading surface 611. The storage device 700 comprises a hard disk drive 701 and a loading tray 702 bearing the hard disk drive 701 and fastened onto loading plate 610. The side plate 620 extends from a side of the loading plate 610 towards the bottom wall 202 of the motherboard tray 200, and is fastened to the side wall 204 of the motherboard tray 200. The supporting legs 630 extend from an opposite side of the loading plate 610 towards the bottom wall 202 of the motherboard tray 200 and are fastened to the other side wall 204 of the motherboard tray 200; as a result, the supporting legs 630 are located between the gaps of the motherboard module 300. For example, the supporting legs 630 can be located between the two memory modules 330 or in the gaps next to the memory module 330. In this embodiment, the number of supporting legs 630 is two. The storage device 700 and the side plates 620 are respectively located on two opposite sides of the loading plate 610. In this embodiment, the side plate 620 and the supporting legs 630 are securely connected to the side wall 204, but the disclosure is not limited thereto. In other embodiments, the side plate 620 and the supporting legs 630 are also securely connected to the bottom wall 202.

The storage device 700 is detachably located on the loading surface 611, and the storage device 700 and the loading plates 610 are located on the two opposite sides of the loading plate 610. The storage device 700 is electrically connected to the sixth electrical connection part 342 via the transmission cable 350.

According to the embodiment of the server, the aim of the first accommodation space and the second accommodation space having its own first storing zone, which is adjacent to the second storing zone located on the shell, is to optimize the interior space allocation of the server, which increases the number of the servers in a limited space to increase the operating efficiency of the server.

Furthermore, it optimizes the circuit layout inside the server by the disposition of the adaption board.

In addition, the dispositions of the assembling wall and the reinforcement plate enhance the strength of the first partition plate and the second partition plate.

What is claimed is:

1. A server, comprising:
   a shell having a first accommodation space; and
   at least one server assembly comprising:
      a motherboard tray detachably located in the first accommodation space;
      a motherboard module located on the motherboard tray, the motherboard module comprises a motherboard and at least one central processing unit located on the motherboard;
      a bearing frame fastened to the motherboard tray and having a loading plate located above the motherboard module, the bearing frame comprising a plurality of supporting mechanisms, and the plurality of supporting mechanisms comprising a side plate and a plurality of supporting legs; and
      a storage device detachably located on the loading plate, wherein the motherboard module locates between the plurality of supporting legs and the side plate, and the storage device and the side plates are respectively located on two opposite sides of the loading plate.

2. The server according to claim 1, wherein the shell further comprises a second accommodation space, the number of at least server assembly is two and the two server assemblies are detachably located in the first accommodation space and in the second accommodation space, respectively.

3. The server according to claim 2, wherein the shell further comprises a base plate, a first lateral plate, a second lateral plate, a first partition plate and a second partition plate, wherein the first lateral plate and the second lateral plate are opposite to each other and are erected on two opposite sides of the base plate, respectively, wherein the first partition plate and the second partition plate are respectively located between the first lateral plate and the second lateral plate and are erected on the base plate, and the first partition plate is located between the first lateral plate and the second partition plate, wherein the first accommodation space is formed between the first partition plate and the first lateral plate, and the second accommodation space is formed between the first partition plate and the second partition plate.

4. The server according to claim 3, wherein the base plate includes a first side edge, a second side edge, a third side edge and a fourth side edge, wherein the second side edge is opposite to the first side edge, and the third side edge and the fourth side edge are located between the first side edge and the second side edge, wherein the first lateral plate and the second lateral plate are respectively erected on the first side edge and the second side edge of the base plate, wherein the shell further comprises an assembling wall having two sides which are opposite to each other and which are connected with the first lateral plate and the second lateral plate, respectively, and wherein a plurality of fans are located on the assembling wall.

5. The server according to claim 4, wherein the first lateral plate comprises a first plate member and a second plate member abutting against each other, the second plate member is located between the first plate member and the first partition plate, the first partition plate comprises a third plate member and a fourth plate member abutting against each other, wherein the third plate member is located between the second plate member and the fourth plate member, both the second plate member and the third plate member each comprise at least one first support part, and the first support parts support the motherboard tray of the server assembly in the first accommodation space, both the fourth plate member and the second partition plate each comprise at least one second support part, and the at least two second support parts support the motherboard tray of the server assembly in the second accommodation space.

6. The server according to claim 5, wherein the second plate member, the third plate member and each of the first support parts respectively located on the second plate member and the third plate member form the first accommodation space therebetween, and wherein the fourth plate member, the second partition plate and each of the second support parts respectively located on the fourth plate member and the second partition plate form the second accommodation space therebetween.

7. The server according to claim 5, wherein the first lateral plate is erected on the first side edge and the second lateral plate is erected on the second side edge; wherein the first partition plate and the second partition plate are parallel to the first lateral plate; the second plate member, the third plate member, the fourth plate member and the second partition plate are all located between the assembling wall and the third side edge.

8. The server according to claim 7, further comprising a first adaption board, the first adaption board having a first electrical connection part and a second electrical connection part, wherein the first electrical connection part corresponds to and is located in the first accommodation space, whereas the second electrical connection part corresponds to and is located in the second accommodation space, wherein each motherboard has a fourth electrical connection part and both of the fourth electrical connection parts are detachably connected to the first electrical connection part and the second electrical connection part, respectively.

9. The server according to claim 8, further comprising a second adaption board, wherein the second adaption board is located above the first adaption board, and the second adaption board has a first electrical connection part and a second electrical connection part, the first electrical connection part of the second adaption board corresponds to and is located in the first accommodation space, whereas the second electrical connection part of the second adaption board corresponds to and is located in the second accommodation space, wherein each of the server assemblies further comprises a support bracket assembling wall, a signal adaption board, the two signal adaption boards are respectively located on the two support brackets and electrically connected to the storage devices respectively, each of the signal adaption boards comprises a fifth electrical connection part, wherein the two fifth electrical connection parts are detachably and respectively connected to the first electrical connection part and the second electrical connection part of the second adaption board.

10. The server according to claim 5, wherein each of the motherboard trays has at two positioning slot located on a side of the motherboard tray close to the assembling wall, the second plate member, the third plate member, the fourth plate member and the second partition plate each have a positioning column, and each of the positioning slots is detachably engaged to each of the positioning columns respectively.

11. The server according to claim 1, wherein the plurality of supporting mechanisms extend from the loading plate toward a bottom wall of the motherboard tray, and the plurality of supporting mechanisms locate at two opposite side of the loading plate and each are fastened to the motherboard tray.

12. The server according to claim 1, wherein the loading plate and the motherboard face to each other and are separated by a distance, the side plate extends from a side of the loading plate is fastened to the motherboard tray, the supporting legs extend from an opposite side of the loading plate and are fastened to the motherboard tray.

13. The server according to claim 12, wherein the motherboard tray has two side walls opposite to each other, the motherboard module locates between the two side walls, the side plate is fastened to one side wall, and the supporting legs are fastened to the other side wall.

14. The server according to claim 1, wherein the storage device comprises a hard disk drive and a loading tray bearing the hard disk drive and fastened onto loading plate.

* * * * *